(12) United States Patent
Ritenour et al.

(10) Patent No.: US 10,811,557 B2
(45) Date of Patent: Oct. 20, 2020

(54) GROWTH STRUCTURE UNDER A RELEASE LAYER FOR MANUFACTURING OF OPTOELECTRONIC DEVICES

(71) Applicant: ALTA DEVICES, INC., Sunnyvale, CA (US)

(72) Inventors: Andrew J. Ritenour, San Jose, CA (US); Ileana Rau, Cupertino, CA (US); Claudio Canizares, San Jose, CA (US); Lori D. Washington, Union City, CA (US); Brendan M. Kayes, Los Gatos, CA (US); Gang He, Cupertino, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 0 days.

(21) Appl. No.: 16/008,919

(22) Filed: Jun. 14, 2018

(65) Prior Publication Data

US 2018/0366609 A1      Dec. 20, 2018

Related U.S. Application Data

(60) Provisional application No. 62/521,241, filed on Jun. 16, 2017.

(51) Int. Cl.
*H01L 21/00* (2006.01)
*H01L 31/18* (2006.01)
(Continued)

(52) U.S. Cl.
CPC .... *H01L 31/1844* (2013.01); *H01L 31/03046* (2013.01); *H01L 31/06875* (2013.01);
(Continued)

(58) Field of Classification Search
CPC .......... H01L 31/1844; H01L 31/03046; H01L 31/06875
See application file for complete search history.

(56) References Cited

U.S. PATENT DOCUMENTS

| | | | |
|---|---|---|---|
| 2011/0186115 A1 | 8/2011 | Wanlass et al. | |
| 2013/0133730 A1* | 5/2013 | Pan | H01L 31/0725 136/255 |

(Continued)

OTHER PUBLICATIONS

International Search Report and Written Opinion corresponding to International Application No. PCT/US2018/037759, dated Nov. 30, 2018.

(Continued)

*Primary Examiner* — Laura M Menz
(74) *Attorney, Agent, or Firm* — Arent Fox LLP

(57) ABSTRACT

A growth structure having a lattice transition under a release layer is used as a seed crystal for growth of optoelectronic devices. The optoelectronic device can be a single- or multi-junction photovoltaic device. The release layer can be selectively removed in an epitaxial lift-off (ELO) process to separate the optoelectronic device from the growth structure and leave the region with the lattice transition intact to reuse the growth structure to grow additional devices. A manufacturing method is described that includes providing a growth structure having a substrate and a lattice transition from a first lattice constant to a second lattice constant, depositing a release layer on the growth structure, depositing on the release layer an epitaxial layer having a lattice constant that matches the second lattice and including an optoelectronic device, and removing the release layer to separate the epitaxial layer and the optoelectronic device from the growth structure.

25 Claims, 9 Drawing Sheets

(51) Int. Cl.
*H01L 31/0687* (2012.01)
*H01L 31/0304* (2006.01)
*H01L 33/00* (2010.01)

(52) U.S. Cl.
CPC ...... *H01L 31/1852* (2013.01); *H01L 31/1892* (2013.01); *H01L 33/0093* (2020.05)

(56) References Cited

U.S. PATENT DOCUMENTS

2018/0366609 A1* 12/2018 Ritenour ............. H01L 31/1892
2019/0259608 A1* 8/2019 Kim .................. H01L 21/02444
2020/0119216 A1* 4/2020 Jain ................... H01L 31/02366
2020/0119222 A1* 4/2020 Jain ..................... H01L 31/1892

OTHER PUBLICATIONS

Kongjaeng, et al, "Structural investigation of InGaAsN films grown on pseudo-lattice-matched InGaAs substrates by metalorganic vapor phase epitaxy," Journal of Crystal Growth, vol. 298, 2007, pp. 111-115.

Zahler, et al, "High efficiency InGaAs solar cells on Si by InP layer transfer," Applied Physics Letters, vol. 91, 2007, pp. 12108-1 to 12108-3.

Partial International Search Report (PCT/ISA/206) dated Sep. 3, 2018 issued in corresponding International Application No. PCT/US2018/037759.

* cited by examiner

GROWTH STRUCTURE UNDER A RELEASE LAYER FOR MANUFACTURING OF OPTOELECTRONIC DEVICES

CROSS REFERENCE TO RELATED APPLICATIONS

The present application claims priority to and the benefit of U.S. Provisional Application No. 62/521,241 entitled "Growth Substrate Under a Release Layer For Manufacturing of Optoelectronic Devices," filed on Jun. 16, 2017, which is incorporated herein by reference in its entirety.

BACKGROUND OF THE DISCLOSURE

Aspects of the present disclosure generally relate to semiconductor substrates used in the manufacturing of optoelectronic devices, and more specifically, to certain growth structures having a semiconductor wafer or substrate, where the growth structures provide a specific lattice constant under a release layer that is subsequently removed to separate the growth structure from an optoelectronic device grown over the release layer.

The bandgaps of semiconductors that can be grown on commercially available wafers (e.g., GaAs and InP) are not ideal for certain types of optoelectronic devices, including but not limited to photovoltaic devices (e.g., solar cells) and light-emitting devices (LEDs). This is due to the restriction that only certain bandgaps can be obtained for a given lattice parameter. For example, lattice constants of commercially available wafers used to manufacture multi-junction photovoltaic devices (e.g., solar cells) may restrict the selection of bandgaps within the solar cell to values which are not ideal (e.g., result in low performance devices). Consequently, the attainable efficiency may be less than what is thermodynamically possible. The conventional way to grow materials with the near-ideal bandgaps on substrates with mismatched lattice constants has been to use graded buffer layers to change the lattice constant inside the epitaxial layer or stack. The mismatch in lattice constant between the seed substrate and the epitaxial layer grown on that substrate is addressed by using a graded buffer layer that is grown as part of the epitaxial layer or stack. Graded buffer layers are slow and costly to grow, add weight and thickness to the finished device, and complicate processing.

Accordingly, techniques that enable manufacturing of optoelectronic devices without graded buffer layers within the optoelectronic device to address mismatches with the substrate are desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In one aspect, a lattice transition (or lattice transition layer), such as a graded buffer layer, for example, with lattice constant that transitions from that of that of the growth structure (approximately 5.653 angstroms (Å) for GaAs, for example) to approximately 5.72 Å is incorporated into a growth structure rather than into an optoelectronic device (e.g., epitaxial stack of a photovoltaic device or solar cell). The growth structure is a layered structure that includes a single-crystal wafer or substrate. The wafer or substrate can be made of a semiconductor, an insulator/oxide (e.g., $La_2O_3$, NaCl), or a combination thereof. In this example, the growth structure can provide the lattice constant of 5.72 Å to enable growth of an all lattice-matched optoelectronic device which contains no graded buffer layers but that includes one or more subcells with near-ideal bandgaps. The lattice-matched optoelectronic device can later be detached from the substrate using an epitaxial lift-off (ELO) process. The ELO process detaches the optoelectronic device leaving the substrate, and the growth structure, intact so that they may be reused. In this manner, the time and cost involved in creating the lattice transition in the growth structure can be shared over multiple uses.

For example, a method of manufacturing an optoelectronic device is described, where the method includes providing a growth structure having a semiconductor substrate or wafer and a lattice transition from a first lattice constant to a second lattice constant, depositing a release or sacrificial layer on the growth structure, depositing an epitaxial layer or stack on the release layer, the optoelectronic device and having a lattice constant that matches the second lattice constant of the growth structure, and removing the release layer to separate the epitaxial layer with the optoelectronic device from the growth structure (e.g., by an ELO process).

In yet another aspect, a method of making a growth structure for manufacturing an optoelectronic device is described, where the method includes depositing a lattice transition layer over a semiconductor wafer (or semiconductor substrate), the lattice transition layer having a transition from a first lattice constant near the semiconductor wafer to a second lattice constant away from the semiconductor wafer, depositing a buffer layer over the lattice transition layer, depositing a release layer over the buffer layer, and providing the semiconductor wafer with the lattice transition layer, the buffer layer, and the release layer to manufacture the optoelectronic device over the release layer (e.g., as part of an ELO process), wherein the optoelectronic device has a lattice constant that matches the second lattice constant. In some instances, the lattice transition layer may be simply referred to as a lattice transition in or within the growth structure.

In another aspect, the growth structure can be an engineered growth structure that is configured to provide the appropriate lattice constant.

For example, a method of manufacturing an optoelectronic device is described, where the method includes providing an engineered growth structure (e.g., an engineered substrate or engineered growth structure) having a desired lattice constant, the engineered growth structure being made from a layer transfer process between two wafers of disparate materials (e.g., by wafer bonding) or from a tertiary material (e.g., InGaAs) and/or quaternary material that produces the lattice constant, depositing a release or sacrificial layer on the engineered growth structure, depositing an epitaxial layer or stack on the release layer, the epitaxial layer including the optoelectronic device and having a lattice constant that matches the lattice constant of the engineered growth structure, and removing the release layer to separate the epitaxial layer with the optoelectronic device from the engineered growth structure (e.g., by an ELO process).

In yet another aspect, a metamorphic layer is grown on a GaAs wafer to form a semiconductor structure so that the final lattice constant of the growth structure is 5.72 Å. As part of a process to manufacture an optoelectronic device (e.g., a photovoltaic device such as a solar cell), first a lattice-matched InGaAs buffer layer is deposited as part of the growth structure (e.g., on a semiconductor substrate or wafer), followed by a release layer of (In)AlAs deposited on the buffer layer. Next a lattice-matched single or multi-junction optoelectronic device is deposited on the release layer as part of an epitaxial layer or stack. For example, a triple junction solar cell that includes one of InGaAs, InGaP, InGaAsP, and AlIn(Ga)P subcells is deposited. Next, the optoelectronic device is separated from the growth structure using an ELO process. The growth structure with the metamorphic layer can then be processed (e.g., cleaned and/or polished) to be re-used to manufacture additional optoelectronic devices.

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, lattice mismatch between the wafer and the epitaxial layer or stack is one issue that arises when using commercially available substrates or wafers. This is generally the case with commercial substrates or wafers made from single or two-atom crystals such as Si, Ge, InP, and GaAs wafers. To address this issue, one or more graded buffer layers are typically incorporated into the epitaxial layer or stack as part of the growth process to change the lattice constant inside the epitaxial layer. This approach makes the manufacturing process slow and costly, and tends to add weight and thickness to the finished device.

In this disclosure, a lattice transition or lattice transition layer, that provides a lattice constant larger than that of the substrate on which it is disposed, is incorporated into a growth structure instead of being incorporated within the optoelectronic device (as would be more typical, for example, in the inverted metamorphic (IMM) design). This approach allows for one or more subcells to be grown as part of the epitaxial layer having near-ideal bandgaps, that is, the desired bandgaps are achieved while enabling lattice matching within the epitaxial layer without the need for graded buffer layers in the epitaxial layer. It is to be understood that similar techniques to those described herein may be used in applications where a lattice transition or lattice transition layer provides a lattice constant smaller than that of the substrate on which it is disposed.

Figure 1A:
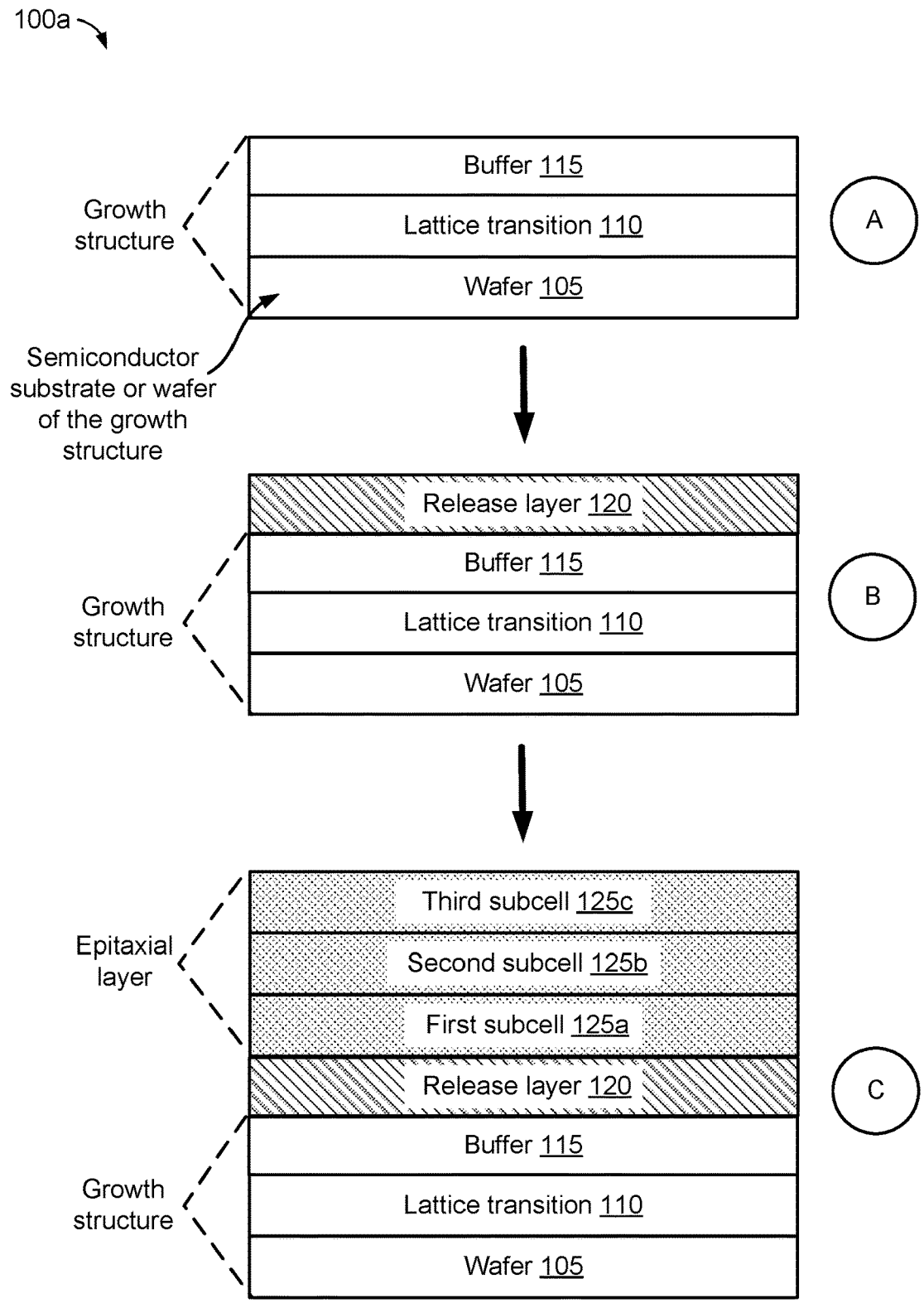
FIGS. 1A and 1B are diagrams that illustrate an example of a process to manufacture an optoelectronic device using a growth structure with a lattice transition in accordance with aspects of this disclosure.

FIG. 1A shows diagram 100a that illustrates part of a process to manufacture an optoelectronic device using a growth structure with a lattice transition. Step A shows a growth structure having a semiconductor substrate or wafer 105, a lattice transition 110 disposed over the wafer 105, and a buffer 115 disposed over the lattice transition 110. The lattice transition 110 can also be referred to as a lattice transition layer. In some example, the lattice transition 110 is epitaxially grown (e.g., deposited) over the wafer 105. The lattice transition 110 is configured to transition from a first lattice constant associated with the wafer 105 to a second lattice constant associated with the buffer 115. For example, if the lattice constant of the wafer 105 is 5.65 Å and the lattice constant of the buffer 115 is 5.72 Å, then the lattice transition 110 provides a lattice constant near the wafer 105 of 5.65 Å and a lattice constant near the buffer 115 of 5.72 Å.

Although various examples described herein are based on the use of a semiconductor substrate or wafer, such as the wafer 105 described above, the disclosure need not be so limited. Single-crystal wafers or substrates, whether they are made of a semiconductor and/or an insulator/oxide(e.g., $La_2O_3$, NaCl), can also be used in the same manner as the wafer 105 and similar wafers described herein.

Step B, which follows Step A, shows a release layer 120 disposed over the growth structure, and more specifically over the buffer 115. The release layer 120 can also be referred to as a sacrificial layer because it is generally removed during an ELO process. The release layer 120 may contain or include an aluminum-containing compound such as AlAs, AlGaAs, or AlInAs, which is susceptible to etching by hydrofluoric acid (HF). When HF is applied as part of the ELO process, the release layer 120 is etched away in order to separate the epitaxial layer from the growth structure. In an aspect, the lattice constant of the release layer 120 can have a range based on the material composition. In one example, the lattice constant of the release layer 120 can be between 5.65 Å and 5.80 Å.

In Step C, which follows Step B, one or more subcells can be disposed over the release layer 120 to form part of an epitaxial layer or epitaxial stack. For example, a first subcell 125a can be disposed over the release layer 120 by, for example, epitaxially growing the first subcell 125a. Optionally, a second subcell 125b can be disposed over the first subcell 125a by, for example, epitaxially growing the second subcell 125b. Also optionally, a third subcell 125c can be disposed over the second subcell 125b by, for example, epitaxially growing the third subcell 125c.

Although the example shown in FIG. 1A includes up to three (3) subcells, it is to be understood that the application is not so limited and that the number of subcells can vary depending on the type of optoelectronic device being manufactured. For example, for a single-junction (1 J) photovoltaic device, the first subcell 125a can be sufficient to produce the 1 J photovoltaic device, where the structure of the first subcell 125a provides for the single junction. Similarly, for a dual-junction (2 J) photovoltaic device, the first subcell 125a and the second subcell 125b can be sufficient to produce the 2 J photovoltaic device, where the structure of the first subcell 125a provides for the first junction and the structure of the second subcell 125b provides for the second junction. The same goes for a triple-junction (3 J) photovoltaic device, where the first subcell 125a, the second subcell 125b, and the third subcell 125c can be sufficient to produce the 3 J photovoltaic device, and where the structure of the first subcell 125a provides for the first junction, the structure of the second subcell 125b provides for the second junction, and the structure of the third subcell 125c provides for the third junction. It is to be understood that these examples of 1 J, 2 J, and 3 J photovoltaic devices can be expanded to photovoltaic devices of four or more junctions by disposing additional subcells. Moreover, the photovoltaic devices having 1 J, 2 J, 3 J or more junctions can be solar cells, and the photovoltaic devices having 1 J can be light-emitting devices, for example.

The first subcell 125a, the second subcell 125b, and the third subcell 125c can have matching lattice constants. For example, each of these subcells can have a lattice constant of between 5.66 Å and 5.89 Å.

Figure 1B:
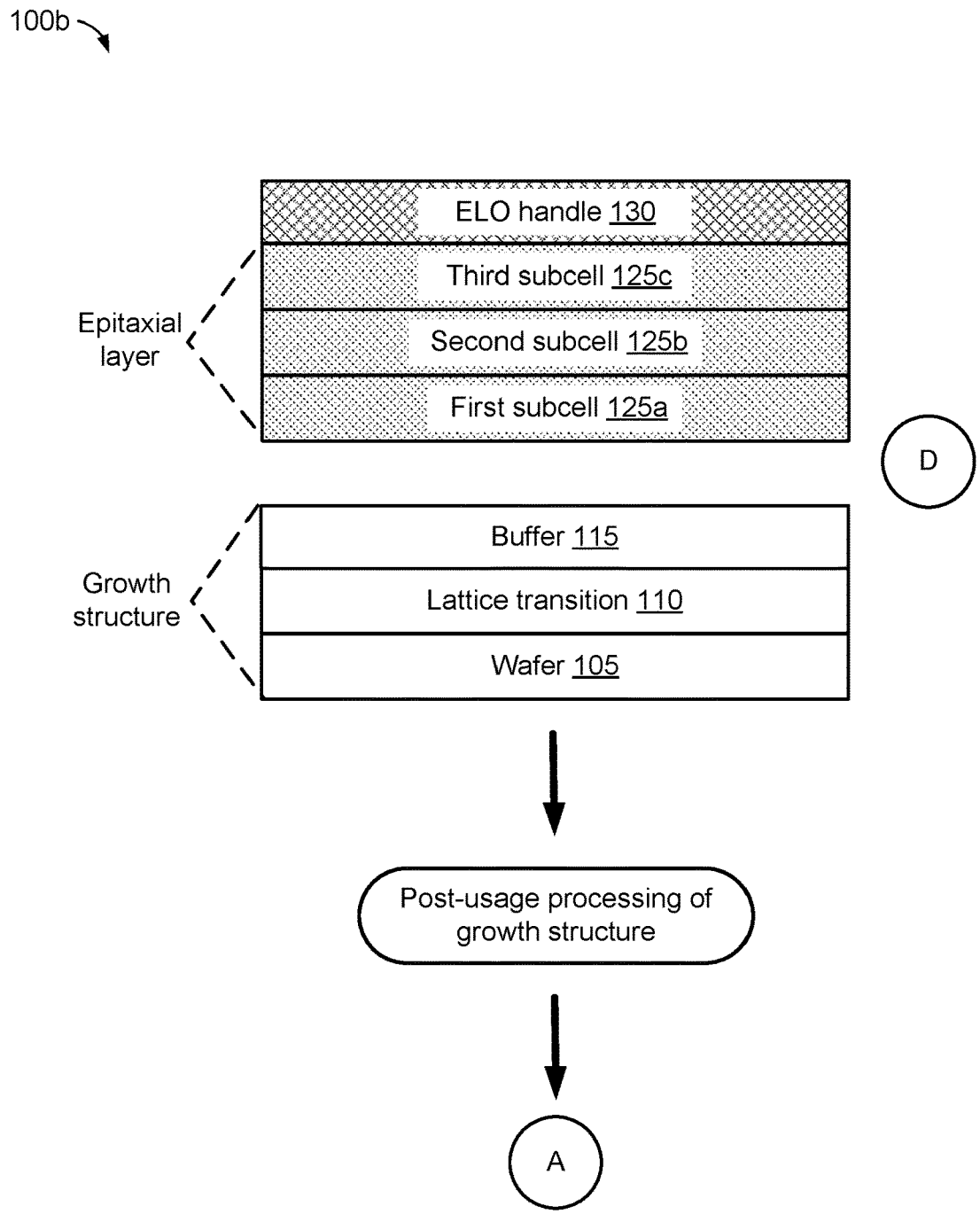

FIG. 1B shows diagram 100b that illustrates a remaining part of the process to manufacture an optoelectronic device using a growth structure with a lattice transition. In Step D, which follows Step C shown in FIG. 1A, an ELO handle 130 is attached to the top subcell (e.g., the third subcell 125c when such a subcell is grown). The ELO handle 130 can be attached using different techniques and/or materials (e.g., different types of adhesives).

In addition, the release layer 120 is removed (e.g., by an etching or similar operation that is part of the ELO process). Upon removal of the release layer 120, the epitaxial layer having the optoelectronic device (e.g., the one or more subcells) is separated from the growth structure having the lattice transition 110 as well as the buffer 115 and the wafer 105. The growth structure can then be cleaned and/or polished to be reused in Step A to grow additional optoelectronic devices.

As shown in FIGS. 1A and 1B, because the lattice transition occurs within the growth structure and not within the epitaxial layer or the electronic device, the time to grow such lattice transition is no longer part of the process to manufacture the optoelectronic device. The cost of growing such a lattice transition within the growth structure is now shared with all the optoelectronic devices made from that same growth structure. Moreover, the weight and thickness associated with the lattice transition are now borne by the growth structure and not by the optoelectronic device (e.g., the epitaxial layer or stack).

Figure 2A:
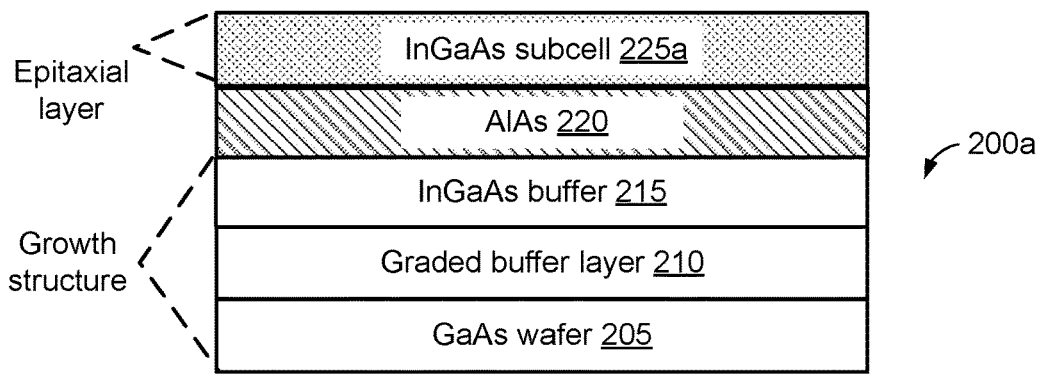
FIGS. 2A-2C are diagrams that illustrates examples of optoelectronic devices with a single junction or multiple subcells manufactured in accordance with aspects of this disclosure.

FIG. 2A shows a diagram 200a that illustrates an example of an optoelectronic device with a single subcell on a growth structure. In this example, the growth structure is similar to the one shown in FIG. 1A and includes a GaAs wafer 205, a graded buffer layer 210 disposed over the GaAs wafer 205, and an InGaAs buffer 215. The graded buffer layer 210 corresponds to the lattice transition 110 in FIG. 1A. The graded buffer layer 210 can be a compositionally graded buffer that includes InGaAs or InGaP, and can be configured to provide a variation or transition in lattice constant from a first lattice constant by the GaAs wafer 205 to a second lattice constant by the InGaAs buffer 215. The compositionally graded buffer can be achieved by changing the stoichiometry of the InGaAs or the InGaP.

Also shown in FIG. 2A is an AlAs 220 disposed over the growth structure and more specifically over the InGaAs buffer 215. The AlAs 220 corresponds to the release layer 120 shown in FIG. 1A. As described above, the release layer 120 can be made of different aluminum-containing compounds including AlAs as well as AlGaAs or AlInAs.

The epitaxial layer in this example, which corresponds to at least a portion of the optoelectronic device, includes a single subcell, which in this case is a first subcell 225a that is an InGaAs subcell.

An example of a single subcell optoelectronic device can be a single-junction (1 J) photovoltaic device (e.g., a single-junction solar cell). In such an example, the lattice constant for the GaAs wafer 205 can be 5.65 Å, the lattice constant for the graded buffer layer 210 can be graded or varied to go from 5.65 Å to 5.89 Å, the lattice constant for the InGaAs buffer 215 can be 5.66 Å to 5.89 Å (for example, 5.67 Å), the lattice constant for the AlAs 220 can range from 5.65 Å to 5.89 Å, and the lattice constant for the InGaAs subcell 225a can be 5.66 Å to 5.89 Å (for example, 5.72 Å).

Figure 2B:
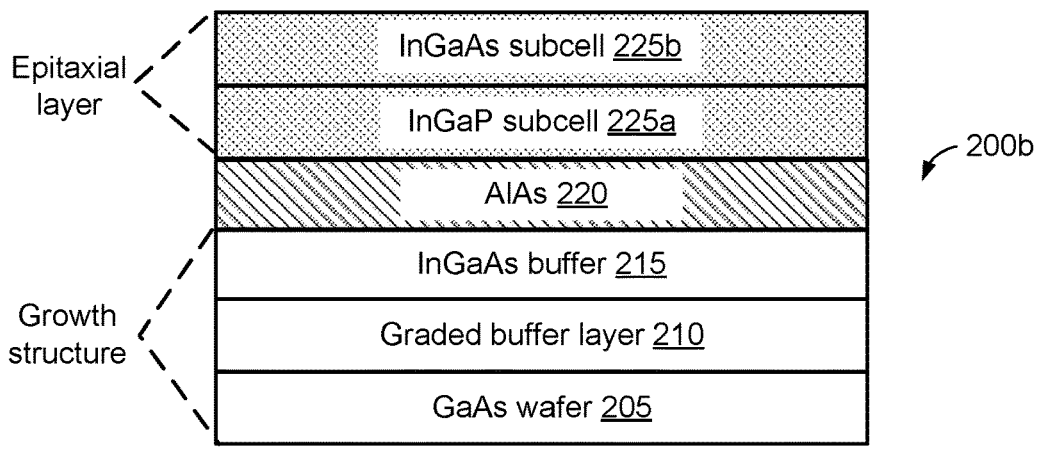

FIG. 2B shows a diagram 200b that illustrates an example of an optoelectronic device with two subcells on a growth structure. In this example, the growth structure is similar to the one shown in FIG. 2A. The AlAs 220 is again disposed over the growth structure and more specifically over the InGaAs buffer 215. The epitaxial layer in this example, which corresponds to at least a portion of the optoelectronic device, includes two subcells, which in this case includes a first subcell 225a that is an InGaP or AlInGaAs subcell and a second subcell 225b that is an InGaAs subcell.

An example of a dual subcell optoelectronic device can be a dual-junction (2 J) photovoltaic device (e.g., a dual-junction solar cell). In such an example, the lattice constant for the GaAs wafer 205 can be 5.65 Å, the lattice constant for the graded buffer layer 210 can be graded or varied to go from 5.65 Å to 5.74 Å, the lattice constant for the InGaAs buffer 215 can be 5.72 Å to 5.74 Å, the lattice constant for the AlAs 220 can range from 5.65 Å to 5.74 Å, and the lattice constant for each of the InGaP subcell 225a and the InGaAs subcell 225b can be 5.72 Å to 5.74 Å.

Figure 2C:
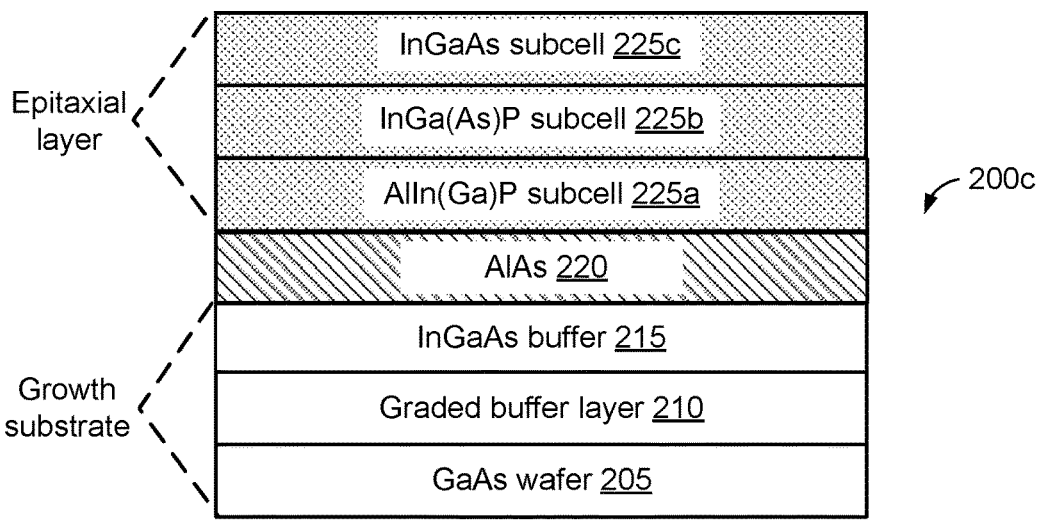

FIG. 2C shows a diagram 200c that illustrates an example of an optoelectronic device with three subcells on a growth structure. In this example, the growth structure is similar to the one shown in FIG. 2A. The AlAs 220 is again disposed over the growth structure and more specifically over the InGaAs buffer 215. The epitaxial layer in this example, which corresponds to at least a portion of the optoelectronic device, includes three subcells, which in this case includes a first subcell 225a that is an AlInGaP or AlInP subcell, a second subcell 225b that is an InGaAsP or InGaP or AlInGaAs subcell, and a third subcell 225c that is an InGaAs subcell.

An example of a triple subcell optoelectronic device can be a triple-junction (3 J) photovoltaic device (e.g., a triple-junction solar cell). In such an example, the lattice constant for the GaAs wafer 205 can be 5.65 Å, the lattice constant for the graded buffer layer 210 can be graded or varied to go from 5.65 Å to 5.80 Å, the lattice constant for the InGaAs buffer 215 can be 5.78 Å to 5.89 Å, the lattice constant for the AlAs 220 can range from 5.65 Å to 5.80 Å, and the lattice constant for each of the AlIn(Ga)P subcell 225*a*, the InGa(As)P subcell 225*b*, and the InGaAs subcell 225*c* can be 5.78 Å to 5.80 Å.

In some instances, in the various examples described herein, a lattice constant of 5.72 Å may refer to a range of 5.72 Å to 5.75 Å, for example. In some instances, the lower value in the range, 5.72 Å, may be preferred. Similarly, other lattice constants used herein may correspond to a range with values that can range within +/−1%.

Moreover, it is to be understood that the optimal lattice constant provided by the growth structure in the various examples described herein may be a function of how many junctions or subcells are part of the epitaxial layer or epitaxial stack and the light spectrum for the intended application.

Figure 3A:
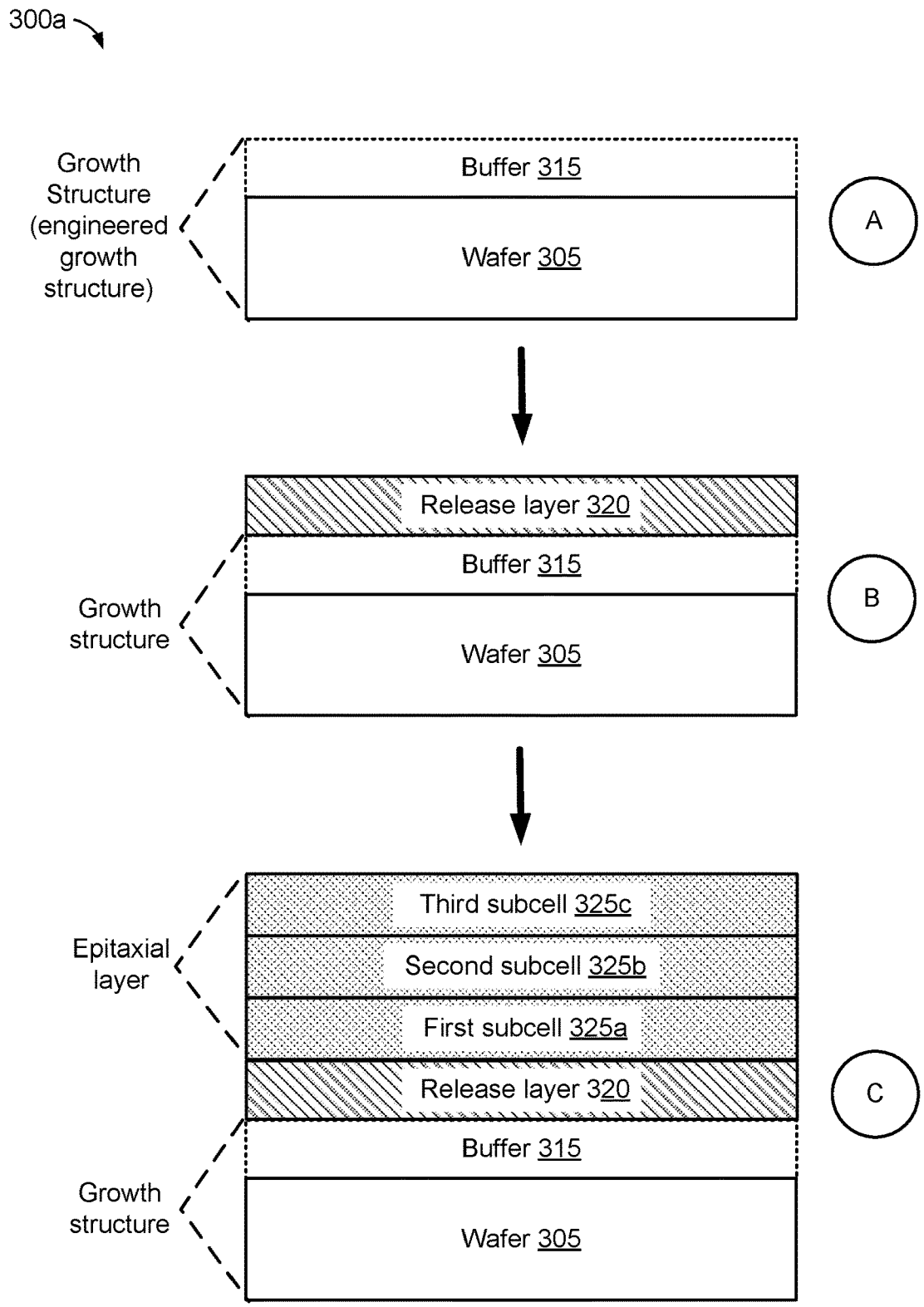
FIGS. 3A and 3B are diagrams that illustrate an example of a process to manufacture an optoelectronic device using an engineered growth structure in accordance with aspects of this disclosure.

FIG. 3A shows diagram 300*a* that illustrates part of a process to manufacture an optoelectronic device using an engineered growth structure. Step A shows an engineered growth structure having a semiconductor wafer 305 and optionally a buffer 315 disposed over the wafer 305. The engineered growth structure can be made by a layer transfer process between two wafers of disparate materials or from a tertiary material (e.g., InGaAs) and/or quaternary material that produces the lattice constant instead of the commercially available single or two-atom materials (e.g., Si, Ge, GaAs, InP). For example, two wafers of different lattice constants can be bonded to produce a specified lattice constant on a surface of the engineered growth structure. In another example, two wafers of different lattice constants can be bonded and a portion of the top wafer can be removed (e.g., by separating part of the top wafer at an ion-implant location) to produce a specified lattice constant on a surface of the engineered growth structure.

In another aspect of FIG. 3A, the buffer 315 is shown as optional as it can be part of the engineered growth structure rather than a separate layer. That is, when configuring, making, or constructing the engineered growth structure, the functional aspects of the buffer 315 can be incorporated into the engineered growth structure.

Step B, which follows Step A, shows a release layer 320 disposed over the engineered growth structure, and more specifically over the buffer 315. The release layer 320 can also be referred to as a sacrificial layer because it is generally removed during an ELO process. The release layer 320 generally contains or includes an aluminum-containing compound such as AlAs, AlGaAs, AlInGaAs, AlInP, AlInGaP, or AlInAs, where the aluminum-containing is susceptible to etching in HF. That is, when HF is applied as part of the ELO process, the release layer 320 is etched away in order to separate the epitaxial layer from the growth structure. In an aspect, the lattice constant of the release layer 320 can have a range based on the material composition. In one example, the lattice constant of the release layer 320 can be between 5.65 Å and 5.89 Å.

In Step C, which follows Step B, one or more subcells can be disposed over the release layer 320 to form part of an epitaxial layer or epitaxial stack. For example, a first subcell 325*a* can be disposed over the release layer 320 by, for example, epitaxially growing the first subcell 325*a*. Optionally, a second subcell 325*b* can be disposed over the first subcell 325*a* by, for example, epitaxially growing the second subcell 325*b*. Also optionally, a third subcell 325*c* can be disposed over the second subcell 325*b* by, for example, epitaxially growing the third subcell 325*c*.

Although the example shown in FIG. 3A includes up to three (3) subcells, it is to be understood that the application is not so limited and that the number of subcells can vary depending on the type of optoelectronic device being manufactured. Four (4), or more, subcells are also possible. Moreover, similar to the examples described above for FIG. 1A, the engineered growth structure described in FIG. 3A can be used to manufacture 1 J, 2 J, and 3 J photovoltaic devices. For example, the first subcell 325*a* can be sufficient to produce the 1 J photovoltaic device, where the structure of the first subcell 325*a* provides for the single junction. The first subcell 325*a* and the second subcell 325*b* can be sufficient to produce the 2 J photovoltaic device, where the structure of the first subcell 325*a* provides for the first junction and the structure of the second subcell 325*b* provides for the second junction. The first subcell 325*a*, the second subcell 325*b*, and the third subcell 325*c* can be sufficient to produce the 3 J photovoltaic device, where the structure of the first subcell 325*a* provides for the first junction, the structure of the second subcell 325*b* provides for the second junction, and the structure of the third subcell 325*c* provides for the third junction.

The first subcell 325*a*, the second subcell 325*b*, and the third subcell 325*c* can have matching lattice constants. For example, each of these subcells can have a lattice constant of 5.74 Å or 5.75 Å.

Figure 3B:
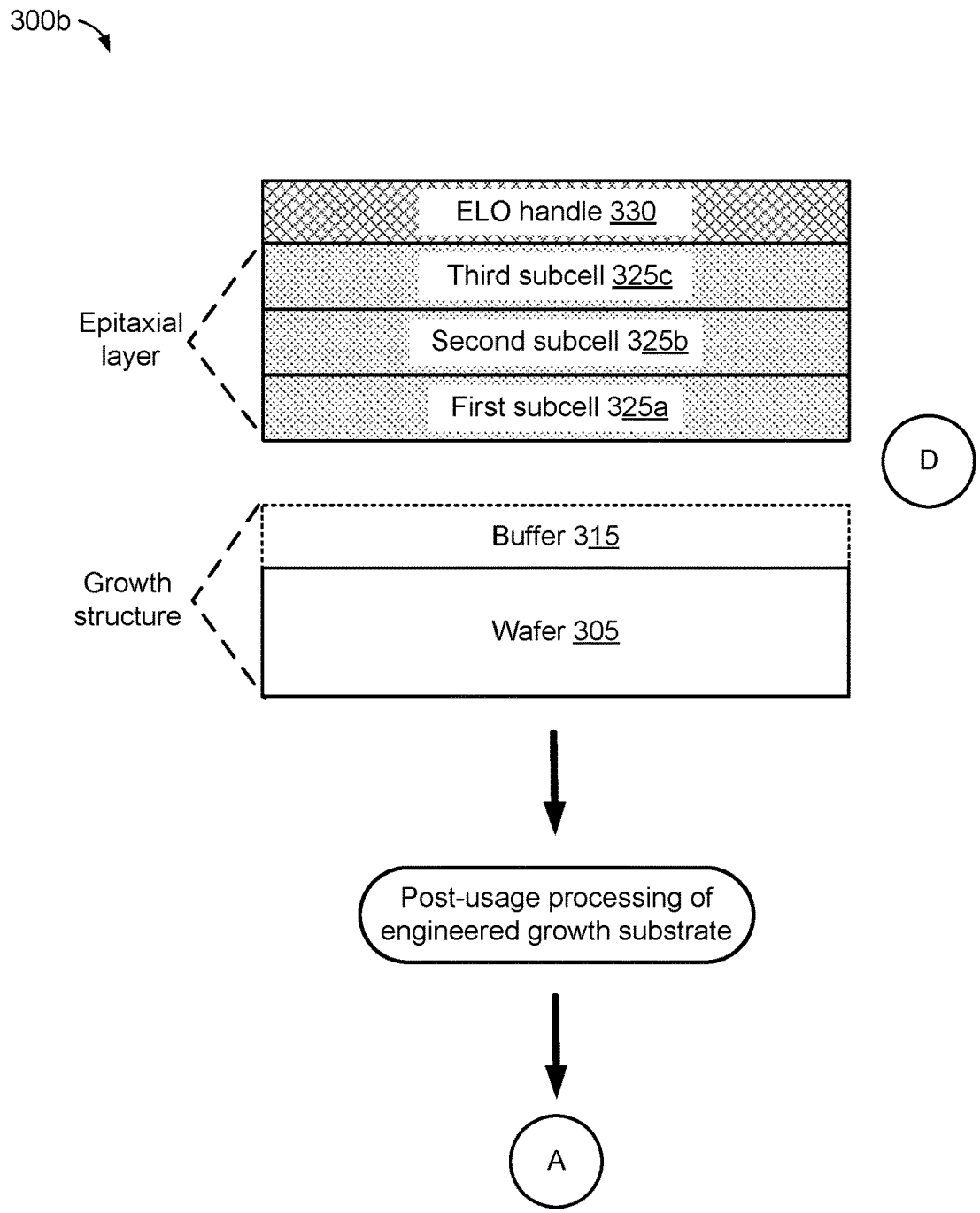

FIG. 3B shows diagram 300*b* that illustrates a remaining part of the process to manufacture an optoelectronic device using an engineered growth structure. In Step D, which follows Step C shown in FIG. 3A, an ELO handle 330 is attached to the top subcell (e.g., the third subcell 325*c* when such a subcell is grown). The ELO handle 330 can be attached using different techniques and/or materials (e.g., different types of adhesives).

In addition, the release layer 320 is removed (e.g., by an etching or similar operation that is part of the ELO process). Upon removal of the release layer 320, the epitaxial layer having the optoelectronic device (e.g., the one or more subcells) is separated from the engineered growth structure. The engineered growth structure can then be cleaned and/or polished to be reused in Step A to grow additional optoelectronic devices.

It is to be understood that the examples of epitaxial layers shown in FIGS. 2A, 2B, and 2C can be similarly grown based on the engineered growth structure described in connection with FIGS. 3A and 3B.

Figure 4A:
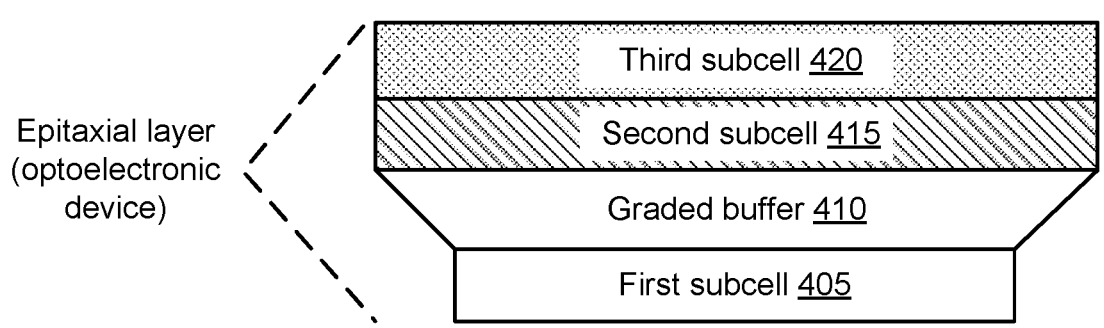
FIGS. 4A and 4B are diagrams that illustrate examples of metamorphic devices manufactured using a growth structure with a lattice transition or an engineered growth structure in accordance with aspects of this disclosure.
Figure 4B:
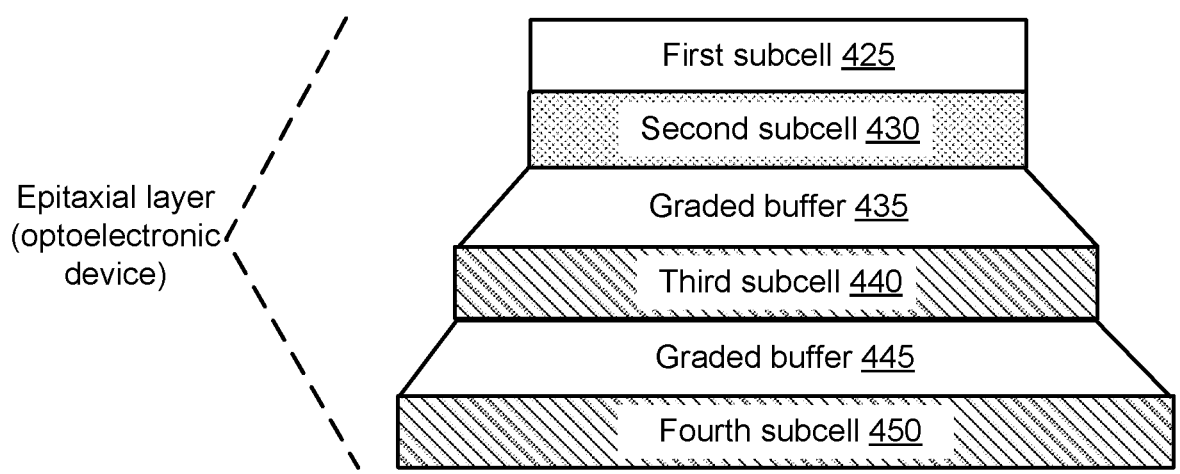

FIGS. 4A and 4B are diagrams that illustrate examples of metamorphic devices manufactured using a growth structure with a lattice transition or an engineered growth structure. Metamorphic devices allow the targeting of semiconductor alloys with ideal or near-ideal bandgaps for the conversion of light into electricity. These devices use metamorphic subcells with a large range of bandgaps as well as graded buffers between two photoactive subcells, where the graded buffers have to have the proper conductivity and transparency for the transmitted portion of the spectrum.

Regarding FIG. 4A, there is shown a structure 400*a* referred to as an upright metamorphic device (or simply a metamorphic device) that corresponds to an epitaxial layer that can be manufactured using the methods described above in connection with FIGS. 1A and 1B (growth structure with lattice transition) and FIGS. 3A and 3B (engineered growth structure). In this structure, there are three (3) subcells. A first subcell 405 is shown with a graded buffer 410 disposed over the first subcell 405. The change in width shown by the block representing the graded buffer 410 is indicative of a change in the lattice constant. For example, the portion of the graded buffer 410 closest to the first subcell 405 has a smaller lattice constant (i.e., a smaller width) than the portion of the graded buffer 410 away from the first subcell 405 (i.e., a larger width).

The structure 400*a* also includes a second subcell 415 disposed over the graded buffer 415 and a third subcell 420 disposed over the graded buffer 410. The second subcell 415 and the third subcell 420 are lattice matched as indicated by their representative blocks having the same width. Moreover, the lattice constant of the second subcell 415 and the third subcell 420 matches the lattice constant of the portion of the graded buffer 410 that is near the second subcell 415.

Regarding FIG. 4B, there is shown a structure 400*b* referred to as an inverted metamorphic device (that corresponds to an epitaxial layer that can be manufactured using the methods described above in connection with FIGS. 1A and 1B (growth structure with lattice transition) and FIGS. 3A and 3B (engineered growth structure). In this structure, there are four (4) subcells. A first subcell 425 is shown disposed over a second subcell 430. The first subcell 425 and the second subcell 430 are lattice matched as indicated by their representative blocks having the same width.

The second subcell 430 is disposed over a graded buffer 435 that is in turn disposed over a third subcell 440. The change in width shown by the block representing the graded buffer 435 is indicative of a change in the lattice constant. For example, the portion of the graded buffer 435 closest to the second subcell 430 has a smaller lattice constant (i.e., a smaller width) than the portion of the graded buffer 435 closes to the third subcell 440 (i.e., a larger width).

The third subcell 440 is disposed over a graded buffer 445 that is in turn disposed over a fourth subcell 450. The change in width shown by the block representing the graded buffer 445 is indicative of a change in the lattice constant. For example, the portion of the graded buffer 445 closest to the third subcell 440 has a smaller lattice constant (i.e., a smaller width) than the portion of the graded buffer 445 closes to the fourth subcell 450 (i.e., a larger width).

It is to be understood that the structures 400*a* and 400*b* are provided by way of example and metamorphic or inverted metamorphic devices with different structures (e.g., different types of subcells, different number of subcells) can also be manufactured using the methods described above in connection with FIGS. 1A and 1B (growth structure with lattice transition) and FIGS. 3A and 3B (engineered growth structure).

Figure 5:
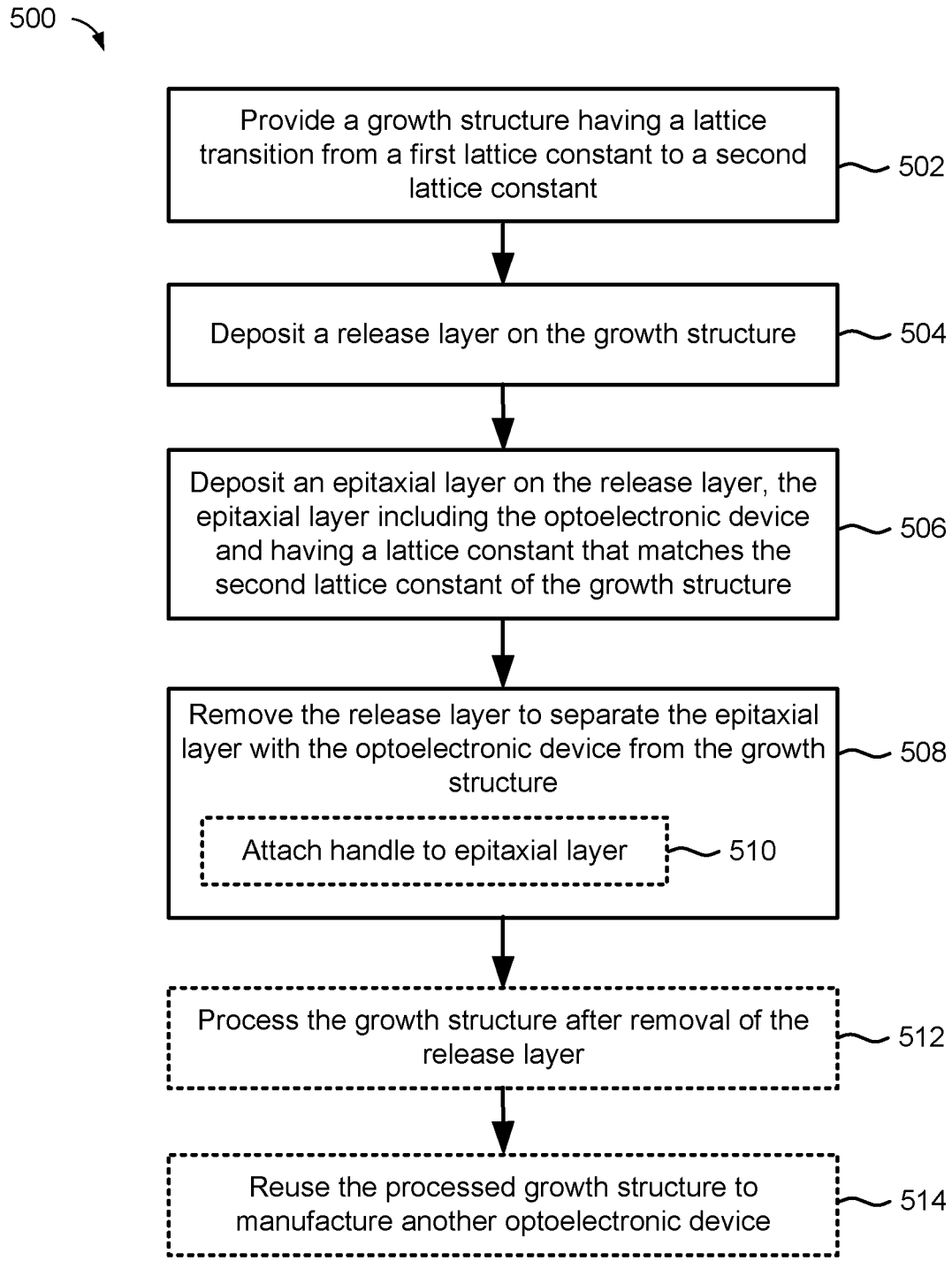
FIG. 5 is a flow chart that illustrates an example of a process to manufacture an optoelectronic device using a growth structure with a lattice transition in accordance with aspects of this disclosure.

FIG. 5 is a flowchart that illustrates a process or method 500 to manufacture an optoelectronic device using a growth structure with a lattice transition. The method 500 illustrated in FIG. 5 corresponds at least in part to the process described above in connection with FIGS. 1A and 1B.

At block 502, the method 500 includes providing a growth structure having a lattice transition (e.g., lattice transition 110) from a first lattice constant to a second lattice constant.

At block 504, the method 500 includes depositing a release layer (e.g., release 120) on the growth structure.

At block 506, the method 500 includes depositing an epitaxial layer on the release layer, where the epitaxial layer includes the optoelectronic device and has a lattice constant that matches the second lattice constant of the growth structure.

At block 508, the method 500 includes removing the release layer to separate the epitaxial layer with the optoelectronic device from the growth structure. At block 510 in block 508, the method 500 may optionally include attaching a handle (e.g., the ELO handle 130) to the epitaxial layer to separate the epitaxial layer from the growth structure when the release layer is removed.

At block 512, the method 500 optionally includes the processing of the growth structure (e.g., cleaning and/or polishing) after the removal of the release layer.

At block 514, the method 500 optionally includes the reuse of the processed growth structure to manufacture additional optoelectronic devices.

In another aspect of the method 500, the growth structure includes a graded layer (e.g., graded buffer layer 210) that provides the transition from the first lattice constant to the second lattice constant. In another aspect, the growth structure includes a buffer layer (e.g., InGaAs buffer 215) deposited over the graded layer, the release layer being deposited over the buffer layer.

In another aspect of the method 500, the epitaxial layer includes at least one subcell that forms the optoelectronic device. For example, the optoelectronic device can be a single-junction photovoltaic device, and the at least one subcell includes a single subcell. The single subcell can be an InGaAs subcell. Moreover, the first lattice constant is in the range of 5.65 angstroms (Å) to 5.66 angstroms and the second lattice constant is in the range of 5.661 angstroms to 5.69 angstroms. In one example, the second lattice constant is 5.67 angstroms.

In another example, the optoelectronic device can be a dual-junction photovoltaic device, and the at least one subcell includes a first subcell and a second subcell. The first subcell can be an InGaP subcell, an InGaAsP subcell or an AlInGaAs subcell positioned closest to the release layer, and the second subcell can be an InGaAs subcell disposed over the first subcell. Moreover, the first lattice constant can be in the range of 5.65 angstroms to 5.66 angstroms and the second lattice constant can be in the range of 5.67 angstroms to 5.89 angstroms. In one example, the second lattice constant is 5.74 angstroms.

In yet another example, the optoelectronic device can be a triple-junction photovoltaic device. In such an example, having at least one subcell may refer to having a first subcell, a second subcell, and a third subcell. The first subcell can be an AlInP subcell or an AlInGaP subcell positioned closest to the release layer, the second subcell can be an InGaP subcell or an InGaAsP subcell or an AlInGaAs subcell disposed over the first subcell, and the third subcell can be an InGaAs subcell disposed over the second subcell.

Moreover, the first lattice constant is about 5.655+/−0.005 angstroms or 5.65+/−0.01 angstroms, and the second lattice constant is in the range of 5.661 angstroms to 5.89 angstroms, the second lattice constant being based partly on the number of junctions in the optoelectronic device. In one example, the second lattice constant is 5.80 angstroms.

In yet another example, the optoelectronic device can be a photovoltaic device with more than three junctions. In such example, having at least one subcell refers to having more than three subcells.

In another aspect of the method 500, the optoelectronic device can be a light-emitting device.

In another aspect of the method 500, the substrate includes a group III-V semiconductor material (e.g., a material made from alloys of indium, gallium, and arsenide). For example, the Group III-V semiconductor material can be GaAs.

In another aspect of the method 500, the substrate, the lattice transition, the release layer, and the epitaxial layer each includes a group III-V semiconductor material.

In another aspect of the method 500, removing the release layer comprises removing the release layer by an epitaxial lift-off (ELO) process. Moreover, the release layer can include an aluminum-containing compound, where the aluminum-containing compound is one of AlAs, AlGaAs, or AlInAs, and where the aluminum-containing is susceptible to etching by hydrofluoric acid (HF) (e.g., as part of an etching operation in the ELO process).

In another aspect of the method 500, the growth structure includes a graded layer that provides the transition from the first lattice constant to the second lattice constant, and where the graded layer is a compositionally graded buffer. The compositionally graded buffer includes InGaAs or InGaP, and the transition from the first lattice constant to the second lattice constant in the compositionally graded buffer is achieved by changing the stoichiometry of the InGaAs or the InGaP (e.g., the relationship between relative quantities in the compound materials).

In another aspect of the method 500, the optoelectronic device can be a metamorphic device (e.g., FIG. 4A) or the optoelectronic device can be an inverted metamorphic device (e.g., FIG. 4B).

Figure 6:
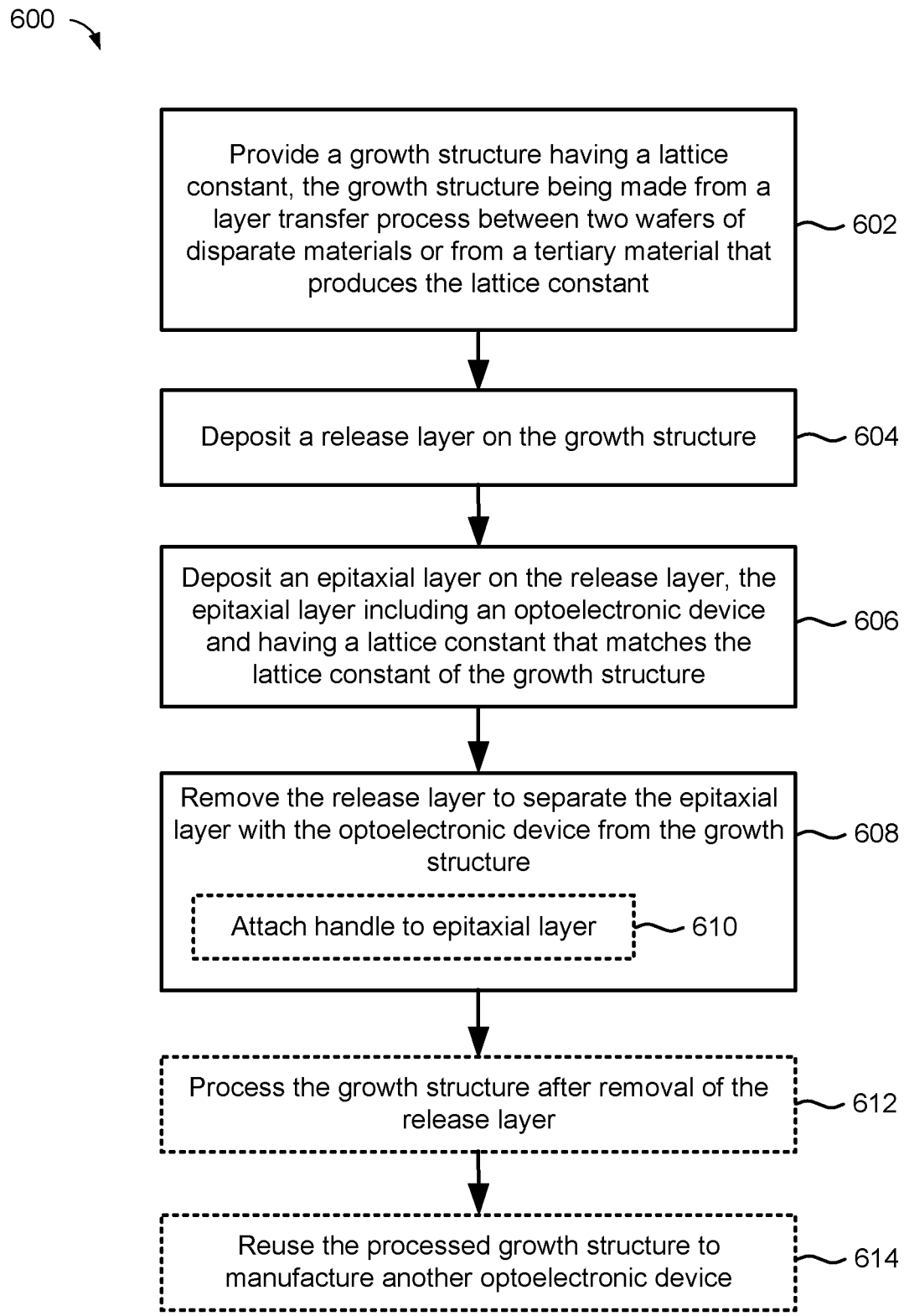
FIG. 6 is a flow chart that illustrates an example of a process to manufacture an optoelectronic device using an engineered growth structure in accordance with aspects of this disclosure.

FIG. 6 is a flowchart that illustrates a process or method 600 to manufacture an optoelectronic device using an engineered growth structure. The method 600 illustrated in FIG. 6 corresponds at least in part to the process described above in connection with FIGS. 3A and 3B.

At block 602, the method 600 includes providing an engineered growth structure having a lattice constant, the engineered growth structure being made from a layer transfer process between two wafers of disparate materials (e.g., wafer bonding) or from a tertiary material (e.g., InGaAs) and/or quaternary material that produces the lattice constant.

At block 604, the method 600 includes depositing a release layer (e.g., release 320) on the engineered growth structure.

At block 606, the method 600 includes depositing an epitaxial layer on the release layer, where the epitaxial layer includes the optoelectronic device and has a lattice constant that matches the lattice constant of the engineered growth structure.

At block 608, the method 600 includes removing the release layer to separate the epitaxial layer with the optoelectronic device from the engineered growth structure. At block 610 in block 608, the method 600 may optionally include attaching a handle (e.g., the ELO handle 330) to the epitaxial layer to separate the epitaxial layer from the engineered growth structure when the release layer is removed.

At block 612, the method 600 optionally includes the processing of the engineered growth structure (e.g., cleaning and/or polishing) after the removal of the release layer.

At block 614, the method 600 optionally includes the reuse of the processed engineered growth structure to manufacture additional optoelectronic devices.

Figure 7:
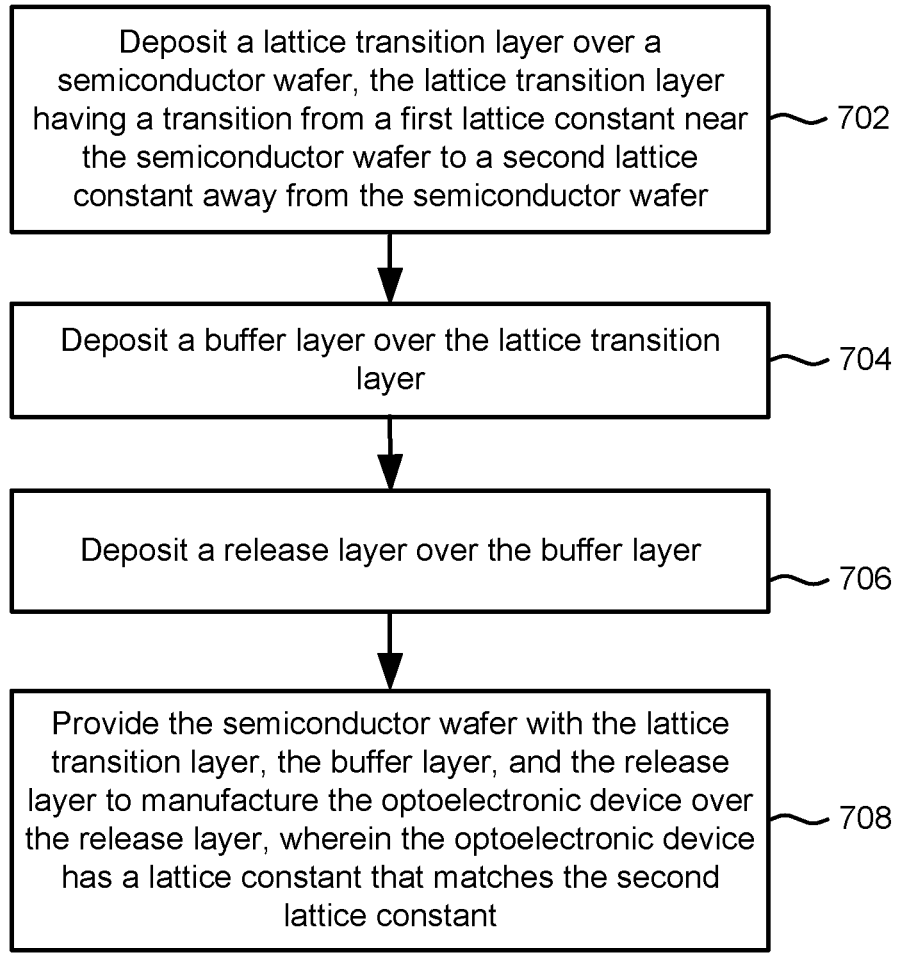
FIG. 7 is a flow chart that illustrates an example of a process to make a semiconductor structure with a lattice transition in accordance with aspects of this disclosure.

FIG. 7 is a flow chart that illustrates a process or method 700 to make a semiconductor structure with a lattice transition in accordance with aspects of this disclosure.

At block 702, the method 700 includes depositing a lattice transition or lattice transition layer (e.g., lattice transition 110) over a semiconductor wafer (e.g., wafer 105), the lattice transition layer having a transition from a first lattice constant near the semiconductor wafer to a second lattice constant away from the semiconductor wafer.

At block 704, the method 700 includes depositing a buffer layer (e.g., buffer 115) over the lattice transition layer.

At block 706, the method 700 includes depositing a release layer (e.g., release layer 120) over the buffer layer.

At block 708, the method 700 includes providing the semiconductor wafer with the lattice transition layer, the buffer layer, and the release layer to manufacture the optoelectronic device over the release layer, wherein the optoelectronic device has a lattice constant that matches the second lattice constant.

While the terms "growth structure" and "engineered growth structure" have been used in this disclosure to respectively refer to a structure with a substrate or wafer and a lattice transition or lattice transition layer and structure with a substrate that is made by a layer transfer process or from a tertiary material and/or quaternary material, it is to be understood that an "engineered growth structure" can also refer to structure with a substrate that has a lattice transition or lattice transition layer.

While the terms "epitaxial layer" and "epitaxial stack" have been used interchangeably in this disclosure, it is to be understood that the term "epitaxial layer" may refer to a single epitaxially-grown layer or to multiple epitaxially-grown layers, and that the term "epitaxial stack" may generally refer to a stack of multiple epitaxially-grown layers.

The terms "substrate" and "wafer" have been used interchangeably in this disclosure, while the terms "growth structure" and "engineered growth structure" may refer to structures that include a substrate or wafer and that may include additional layers over the substrate or wafer.

Although some of the examples described herein refer to a semiconductor structure, it is to be understood that such structures can include other materials. For example, some structures are referred to as semiconductor structures because of the use of a semiconductor wafer or substrate; however, a semiconductor structure may use instead an insulator or oxide as a wafer or substrate, while other layers of the semiconductor structure are made of a semiconductor material. Accordingly, the terms "semiconductor structure" and "structure" may be used interchangeably to refer to a structure in which at least one of the layers is a semiconductor layer, whether that layer is a wafer or substrate or some other layer.

It is also to be understood that while the disclosure refers to the "optoelectronic device" as being part of an epitaxial layer or stack, the "optoelectronic device" refers to the functional portion or segment of an operational device (e.g., solar cell, LED) that is constructed by the epitaxial layer or stack. As such, the operational device includes, at least in part, the optoelectronic device.

Although the present disclosure has been provided in accordance with the implementations shown, one of ordinary skill in the art will readily recognize that there could be variations to the embodiments and those variations would be within the scope of the present disclosure. For example, different materials, structures, subcells, and/or optoelectronic devices can be contemplated that are consistent with the techniques described in this disclosure. Accordingly, many modifications may be made by one of ordinary skill in the art without departing from the scope of the appended claims.

What is claimed is:

1. A method of manufacturing an optoelectronic device, the method comprising:
providing a growth structure having a substrate, a graded layer that provides a lattice transition from a first lattice constant to a second lattice constant, and a buffer layer disposed over the graded layer, wherein the buffer layer has a buffer lattice constant that matches or is near the second lattice constant of the growth structure;
depositing a release layer over the buffer layer, wherein the release layer has a release lattice constant that matches or is near the second lattice constant;

depositing an epitaxial layer on the release layer, the epitaxial layer including the optoelectronic device and having an epitaxial lattice constant that matches or is near the second lattice constant of the growth structure; and removing the release layer to separate the epitaxial layer with the optoelectronic device from the growth structure.

2. The method of claim 1, wherein the epitaxial layer includes at least one subcell that forms the optoelectronic device.

3. The method of claim 2, wherein:
the optoelectronic device is a single-junction photovoltaic device, and
the at least one subcell includes a single subcell.

4. The method of claim 3, wherein the single subcell is an InGaAs subcell.

5. The method of claim 4, wherein the first lattice constant is in the range of 5.65 angstroms to 5.66 angstroms and the second lattice constant is in the range of 5.661 angstroms to 5.69 angstroms.

6. The method of claim 2, wherein:
the optoelectronic device is a double-junction photovoltaic device, and
the at least one subcell includes a first subcell and a second subcell.

7. The method of claim 6, wherein:
the first subcell is an InGaP subcell or an AlInGaAs subcell positioned closest to the release layer, and
the second subcell is an InGaAs subcell disposed over the first subcell.

8. The method of claim 7, wherein the first lattice constant is in the range of 5.65 angstroms to 5.66 angstroms and the second lattice constant is in the range of 5.67 angstroms to 5.85 angstroms.

9. The method of claim 2, wherein:
the optoelectronic device is a triple-junction photovoltaic device, and
the at least one subcell includes a first subcell, a second subcell, and a third subcell.

10. The method of claim 9, wherein:
the first subcell is an AlInP subcell or an AlInGaP subcell positioned closest to the release layer,
the second subcell is an InGaP subcell or an InGaAsP subcell or an AlInGaAs subcell disposed over the first subcell, and
the third subcell is an InGaAs subcell disposed over the second subcell.

11. The method of claim 10, wherein the first lattice constant is about 5.655+/−0.005 angstroms or 5.65+/−0.01 angstroms, and the second lattice constant is in the range of 5.661 angstroms to 5.85 angstroms, the second lattice constant being based on a number of junctions in the optoelectronic device.

12. The method of claim 2, wherein:
the optoelectronic device is a photovoltaic device with more than three junctions, and
the at least one subcell includes more than three subcells.

13. The method of claim 1, wherein removing the release layer includes attaching a handle to the epitaxial layer.

14. The method of claim 1, further comprising:
processing the growth structure after removal of the release layer; and
reusing the processed growth structure to manufacture another optoelectronic device.

15. The method of claim 1, wherein the optoelectronic device is a light-emitting device.

16. The method of claim 1, wherein the substrate of the growth structure includes a Group III-V material.

17. The method of claim 16, wherein the III-V material is GaAs.

18. The method of claim 1, wherein each of the substrate of the growth structure, the lattice transition of the growth structure, the release layer, and the epitaxial layer includes a Group III-V material.

19. The method of claim 1, wherein the release layer includes an aluminum-containing compound.

20. The method of claim 19, wherein the aluminum-containing compound is one of AlAs, AlGaAs, AlInGaAs, AlInP, AlInGaP, or AlInAs, and wherein the aluminum-containing is susceptible to etching by hydrofluoric acid (HF).

21. The method of claim 1, wherein removing the release layer comprises removing the release layer by an epitaxial lift-off (ELO) process.

22. The method of claim 1, wherein the graded layer is a compositionally graded buffer.

23. The method of claim 22, wherein the compositionally graded buffer includes InGaAs or InGaP, and wherein the transition from the first lattice constant to the second lattice constant in the compositionally graded buffer is achieved by changing the stoichiometry of the InGaAs or the InGaP.

24. The method of claim 1, wherein the optoelectronic device is a metamorphic device.

25. The method of claim 1, wherein the optoelectronic device is an inverted metamorphic device.

* * * * *